(12) United States Patent
Phillips et al.

(10) Patent No.: US 9,063,188 B2
(45) Date of Patent: Jun. 23, 2015

(54) APPARATUS AND METHOD FOR IDENTIFYING HIGH RISK NON-CERAMIC INSULATORS (NCI) WITH CONDUCTIVE OR HIGH PERMITTIVITY DEFECTS

(75) Inventors: Andrew John Phillips, Harrisburg, NC (US); Mark Major, San Antonio, TX (US); Robert Carlton Lynch, Fuquay-Varina, NC (US); Phillip Nathan Beverly, San Antonio, TX (US); Sam Harrell, Concord, NC (US)

(73) Assignee: Electric Power Research Institute, Inc., Charlotte, NC (US)

( * ) Notice: Subject to any disclaimer, the term of this patent is extended or adjusted under 35 U.S.C. 154(b) by 446 days.

(21) Appl. No.: 13/587,523

(22) Filed: Aug. 16, 2012

(65) Prior Publication Data

US 2013/0043881 A1 Feb. 21, 2013

Related U.S. Application Data

(60) Provisional application No. 61/525,781, filed on Aug. 21, 2011.

(51) Int. Cl.
*H01H 31/12* (2006.01)
*G01R 31/12* (2006.01)
*G01R 1/067* (2006.01)

(52) U.S. Cl.
CPC ............ *G01R 31/12* (2013.01); *G01R 1/06777* (2013.01); *G01R 31/1245* (2013.01)

(58) Field of Classification Search
CPC . G01R 31/12; G01R 1/06777; G01R 31/1245
USPC .......... 324/551–559, 500, 519–523; 250/282, 250/292, 281, 283, 293, 290
See application file for complete search history.

(56) References Cited

U.S. PATENT DOCUMENTS

| 5,491,411 | A * | 2/1996 | Wellstood et al. ............ 324/248 |
| 5,792,996 | A * | 8/1998 | Phillips et al. ................ 174/174 |
| 6,854,493 | B2 * | 2/2005 | Ichikawa et al. ............. 141/301 |
| 7,486,084 | B2 | 2/2009 | Phillips et al. |
| 2001/0022541 | A1 * | 9/2001 | Kasai et al. ................... 333/105 |
| 2002/0074221 | A1 * | 6/2002 | Mallinson et al. ............ 204/170 |
| 2002/0156385 | A1 * | 10/2002 | Feng et al. .................... 600/515 |

(Continued)

FOREIGN PATENT DOCUMENTS

| EP | 2006699 | 12/2008 |
| RU | 2212678 | 9/2003 |

OTHER PUBLICATIONS

WIPO, International Search Report, Nov. 9, 2012, Russia.

*Primary Examiner* — Melissa Koval
*Assistant Examiner* — Trung Nguyen
(74) *Attorney, Agent, or Firm* — Trego, Hines & Ladenheim, PLLC

(57) ABSTRACT

An apparatus and method for identifying the presence of high conductivity or permittivity conditions in a wide range of electrically insulating materials is disclosed. The apparatus includes a grounded enclosure containing electronics for controlling measurement and communication processes and first and second spaced-apart electrode assemblies for engaging an insulator to be tested. The first and second electrode assemblies are mounted in the enclosure for linear movement such that pressing of the first and second electrodes against an insulator causes the electronics to initiate a measurement.

19 Claims, 9 Drawing Sheets

(56) References Cited

U.S. PATENT DOCUMENTS

| | | | |
|---|---|---|---|
| 2005/0262944 A1* | 12/2005 | Bennett et al. | 73/592 |
| 2008/0100299 A1* | 5/2008 | Phillips et al. | 324/439 |
| 2010/0100239 A1 | 4/2010 | Park et al. | |
| 2011/0101989 A1 | 5/2011 | Hyde et al. | |

* cited by examiner

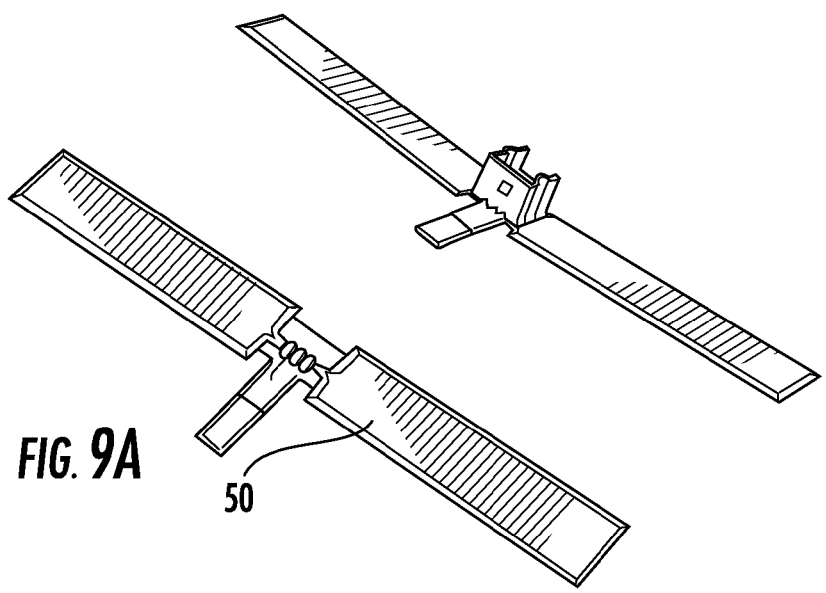
FIG. 9A
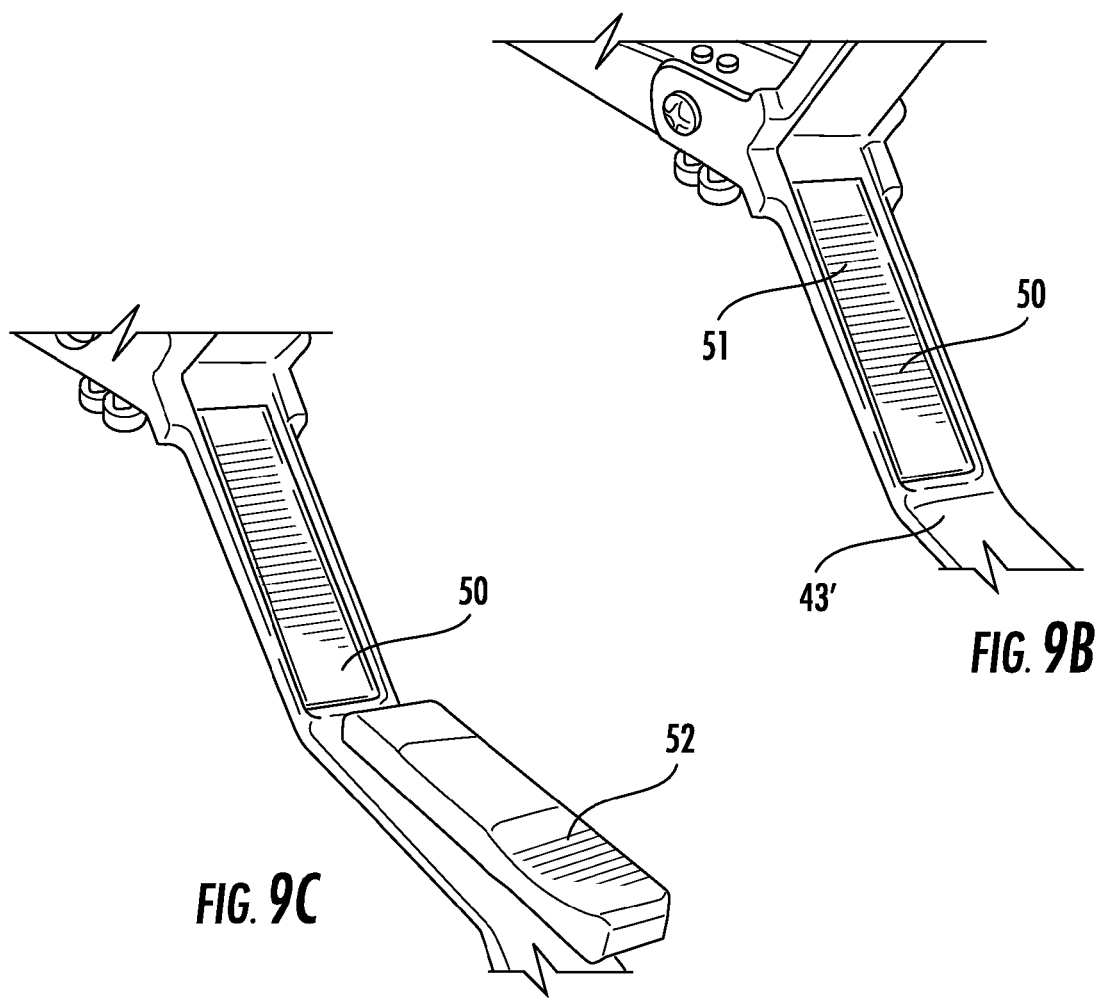
FIG. 9B
FIG. 9C

APPARATUS AND METHOD FOR IDENTIFYING HIGH RISK NON-CERAMIC INSULATORS (NCI) WITH CONDUCTIVE OR HIGH PERMITTIVITY DEFECTS

This application claims the benefit of Provisional Application No. 61/525,781 filed on Aug. 21, 2011.

BACKGROUND OF THE INVENTION

This application relates to an apparatus and method for identifying the presence of high conductivity or permittivity conditions in a wide range of electrically insulating materials and, more particularly, to a detector to assess the electrical integrity of a polymer insulator.

Insulators are utilized in many applications on transmission and distribution systems. The main application of an insulator is to mechanically attach current carrying conductors to support grounded structures while electrically insulating the conductors from the grounded structures.

Non-ceramic insulators (NCI) (also called polymer or composite insulators) are considered high risk if they contain internal or external defects of conductive or high permittivity. An example of a conductive defect would include internal carbonization of the fiberglass rod due to discharge activity, and an example of a high permittivity defect would be water internal to the insulator.

A requirement for ensuring worker safety when performing live work (LW) with polymer insulators is to confirm the short-term (i.e. for the duration of the work) electrical and mechanical integrity of both the installed and the replacement polymer units. Currently there are no generally accepted and easily applied procedures to accomplish this. Consequently, some utilities have opted not to use polymer insulators. In addition, a number of utilities that do use polymer insulators avoid live work on structures on which these insulators have been installed.

Accordingly, there is a need for an apparatus and method that can identify electrical and mechanical integrity of both installed and replacement polymer insulators.

BRIEF SUMMARY OF THE INVENTION

These and other shortcomings of the prior art are addressed by the present invention, which provides an apparatus for identifying high risk insulators with conductive or high permittivity defects. The apparatus includes a metallic enclosure containing electronics for controlling measurement and communication processes, and first and second spaced-apart electrode assemblies for engaging an insulator to be tested. The first and second electrode assemblies are mounted in the enclosure for linear movement such that pressing of the first and second electrodes against an insulator causes the electronics to initiate a measurement.

According to an aspect of the invention, an apparatus for identifying high risk insulators with conductive or high permittivity defects includes a chassis having a plurality of apertures and first and second rails, electronics mounted to the metallic chassis which is electrically grounded to the metallic enclosure for controlling measurement and communication processes, a high voltage electrode assembly connected to the chassis by a spring loaded mechanism to allow the high voltage electrode assembly to move linearly in and out from the chassis, and a grounded electrode assembly connected to the metallic chassis by a moveable plate and to the moveable plate by a spring loaded mechanism. The moveable plate is adapted to move along the first and second rails to position the grounded electrode at a pre-determined spacing from the high voltage electrode assembly and the spring loaded mechanism is adapted to allow the grounded electrode assembly to move linearly in and out from the chassis. When the high voltage electrode assembly and grounded electrode assembly are pushed against an insulator, the electrode assemblies move linearly inward towards the chassis, thereby causing the electronics to initiate a test.

According to another aspect of the invention, a method of evaluating insulators for defects includes the steps of providing an apparatus for identifying high risk insulators having a microprocessor, a high voltage electrode assembly, and a grounded electrode assembly. The method further includes the steps of engaging the high voltage electrode assembly and grounded electrode assembly with an insulator to be tested, submitting the insulator to a high voltage at various frequencies to determine a resonance frequency of the insulator, submitting the insulator to a high voltage at the resonance frequency for a pre-determined amount of time, and conducting measurements during the pre-determined amount of time for comparison to a calibration result set.

BRIEF DESCRIPTION OF THE DRAWINGS

The subject matter that is regarded as the invention may be best understood by reference to the following description taken in conjunction with the accompanying drawing figures in which:

FIGS. 8 and 9A-9C show electrode assemblies of the apparatus of FIG. 1.

DETAILED DESCRIPTION OF THE INVENTION

Figure 1:
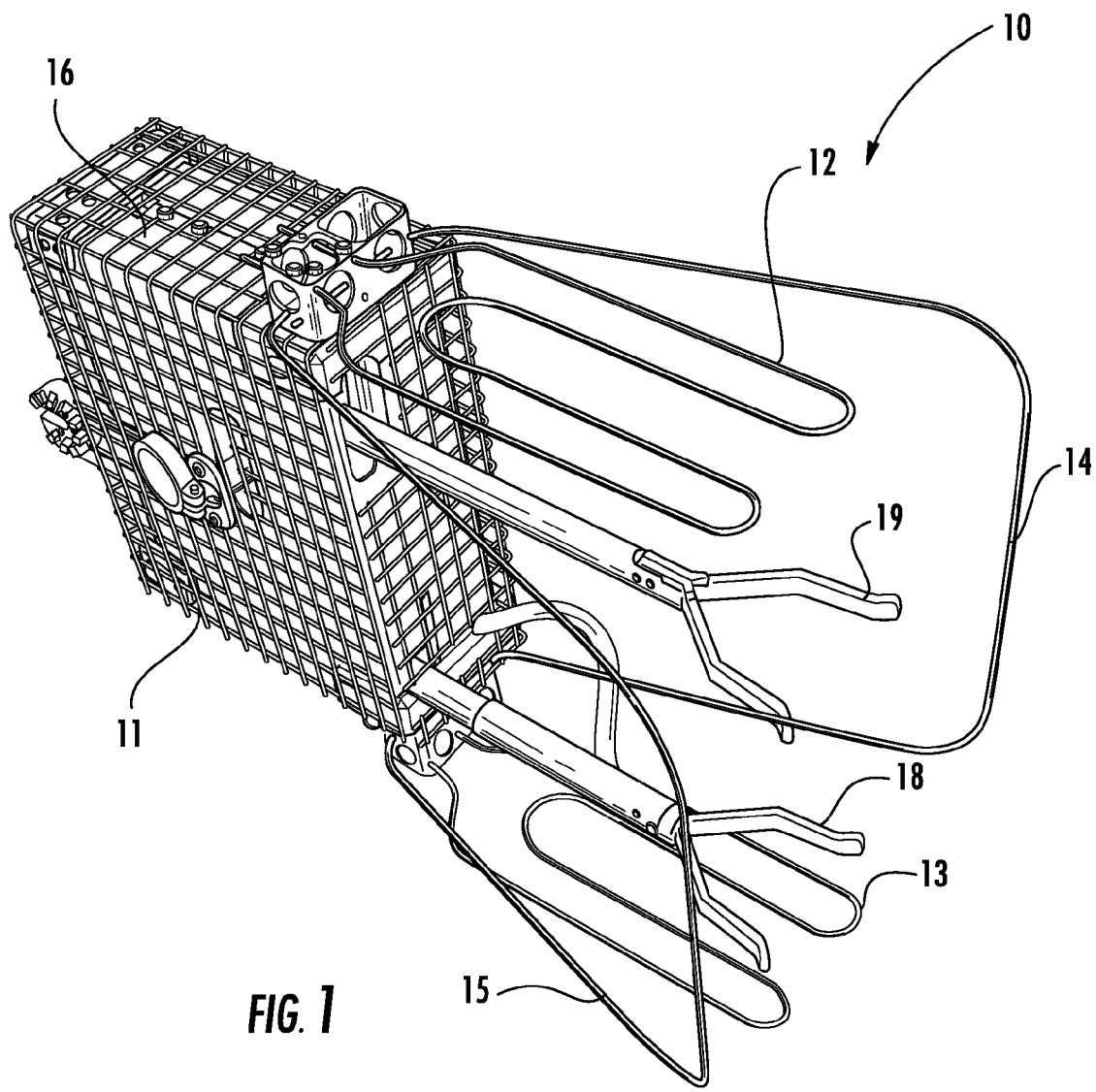
FIG. 1 is a perspective view of an apparatus according to an embodiment of the invention.
Figure 2:
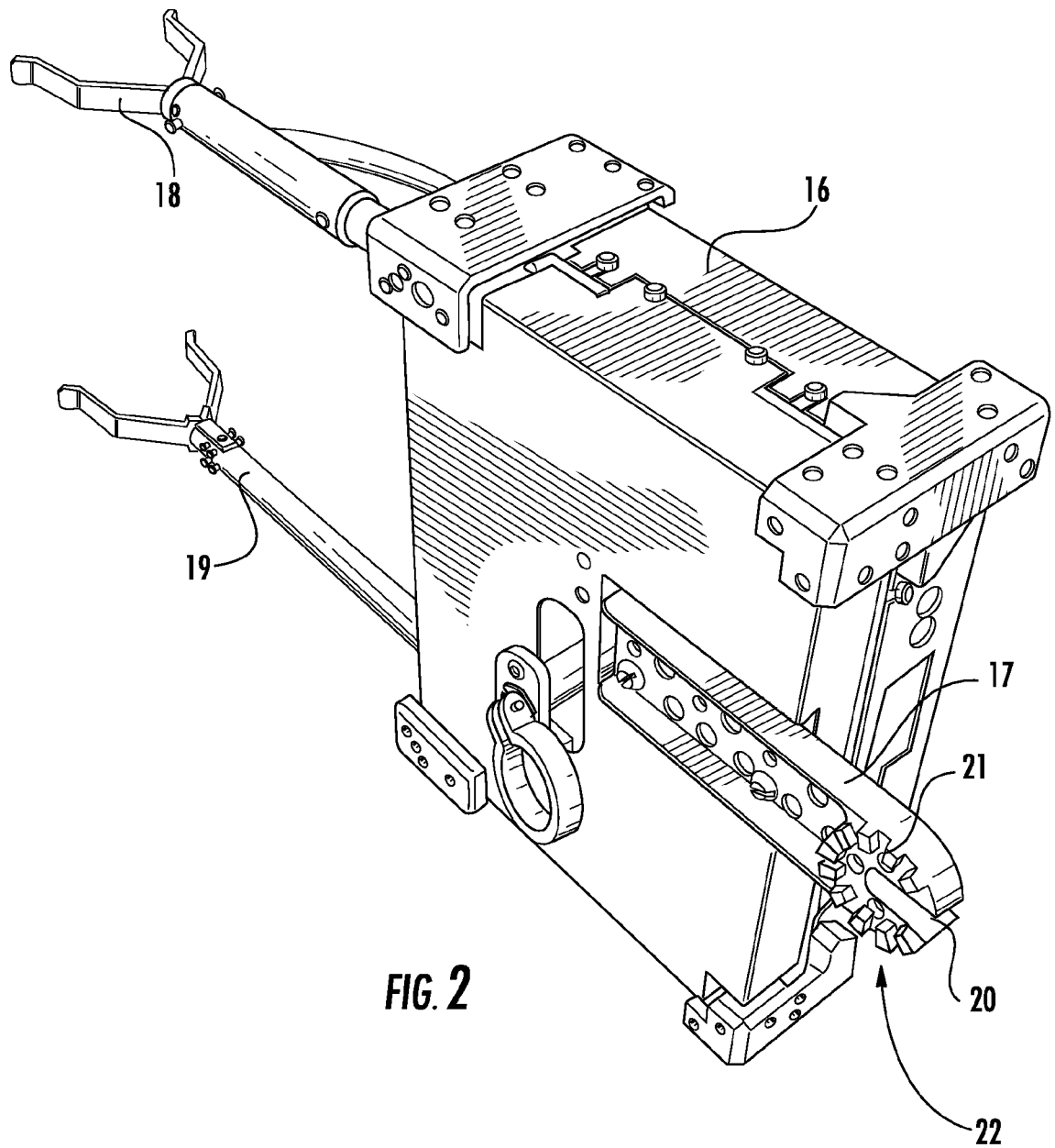
FIG. 2 is a rear perspective view of the apparatus of FIG. 1.

Referring to the drawings, an exemplary apparatus in form of a detector according to an embodiment of the invention is illustrated in FIGS. 1 and 2 and shown generally at reference numeral 10.

The detector 10 has the capacity to identify conductive, semi-conductive or high permittivity conditions, both internal and external without physical contact with internal conductive defects. The detector 10 is able to identify conductive, semi-conductive and high permittivity internal conditions which occur in service and are small in dimension electrically.

Figure 3:
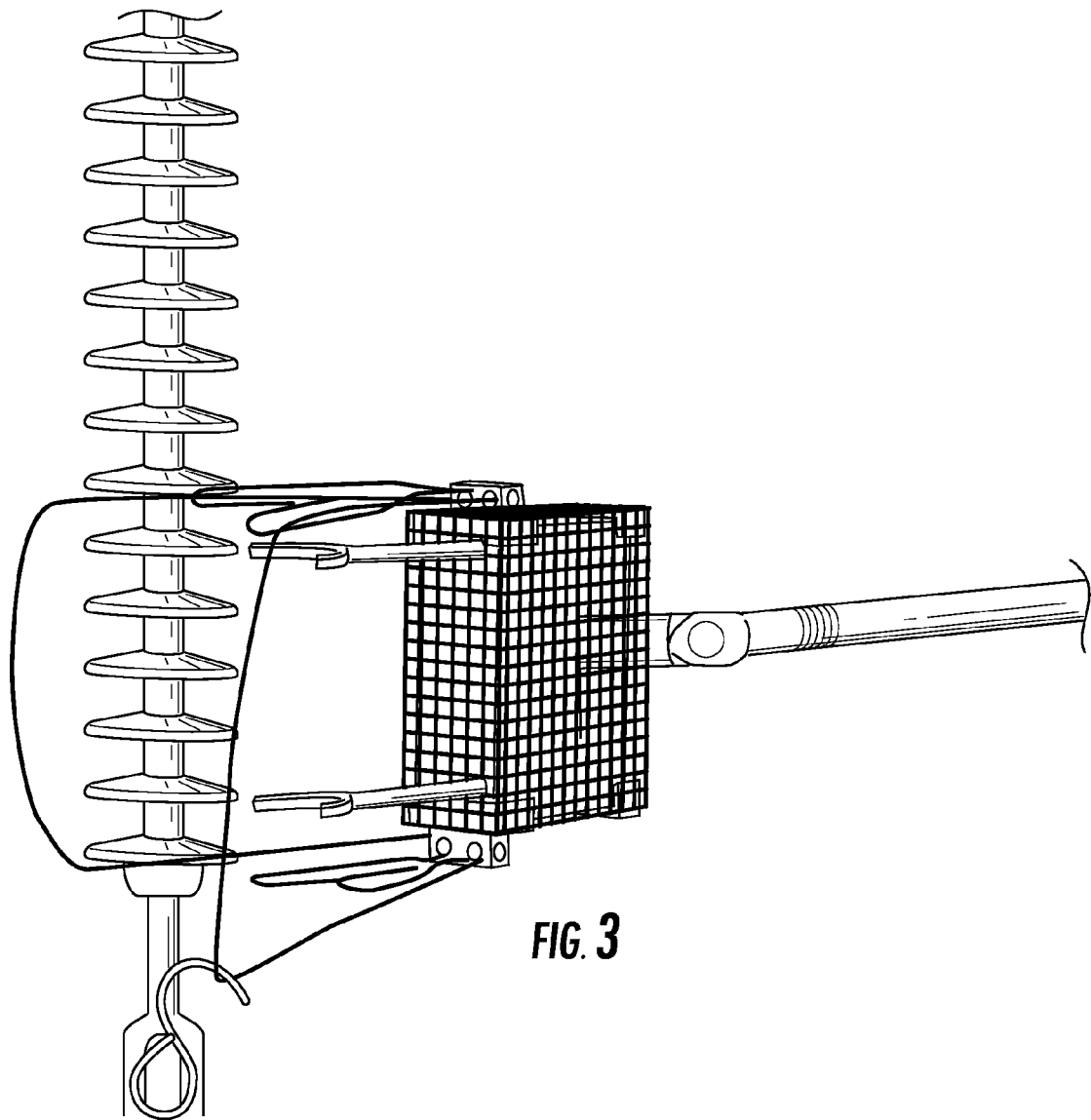
FIG. 3 shows the apparatus of FIG. 1 being installed on an insulator.

The detector 10 is portable, self-contained, lightweight, able to be used on energized installed insulators, may be installed on the end of a "hotstick" (FIG. 3) or held by hand, and provides a simple Go/No-Go output. The detector 10 is not only applicable to polymer insulators, but also to other insulating components such as fiberglass hot sticks, guy strain insulators, fiberglass cross-arms, composite poles, and the like. Thus, the technology incorporated in the detector 10 does not necessarily need to be utilized to evaluate components that fill an electrical function; rather, it is applicable to any component which is manufactured from a material having insulating properties and the internal or external condition being sought is conductive, semi-conductive, or has a high permittivity.

As shown, the detector 10 includes a Faraday cage 11 (also called a guard electrode), a tuning forks 12 and 13, bunny ears 14 and 15, a grounded enclosure 16, a universal hotstick receiver 17, a high voltage electrode assembly 18, and a grounded electrode assembly 19. The cage 11 houses the enclosure 16 and ensures that measurements taken by the detector 10 are not impacted by the presence of nearby conductive objects. The cage 11 also reduces high electric field and arcing effects on the detector 10 when it is in energized environments. The enclosure 16 may be bonded to the cage 11 or floating with respect to the cage 11. As shown, the enclosure 16 is floating and houses all of the electronics needed for the detector 10 to operate, including circuit boards, batteries, and power supplies to shield the electronics from electrical disturbances, electric fields, and arcing.

The tuning forks 12, 13 and bunny ears 14, 15 extend the Faraday cage 11 around the electrode assemblies 18 and 19. The tuning forks 12 and 13 are designed such that they make mechanical and electrical contact with end fittings of an insulator (FIG. 3) to prevent arcing to the detector 10 when measurements are being made close to energized and grounded end fittings of an insulator.

The receiver 17 is connected to the enclosure 16 and is bonded to the cage 11. The receiver 17 is adapted to receive and connect to a hotstick to allow the detector 10 to be placed on an energized insulator. The receiver 17 includes a slot 20 for receiving a connector of a hotstick and a plurality of blocks 21 to form a castellated end 22 that meshes with a castellated end of the hotstick, thereby preventing the detector from rotating with respect to the hotstick during installation. The castellated end 22 also allows the hotstick to be secured to the detector 10 at various angles relative to the hotstick to allow for easier installation.

Figure 4:
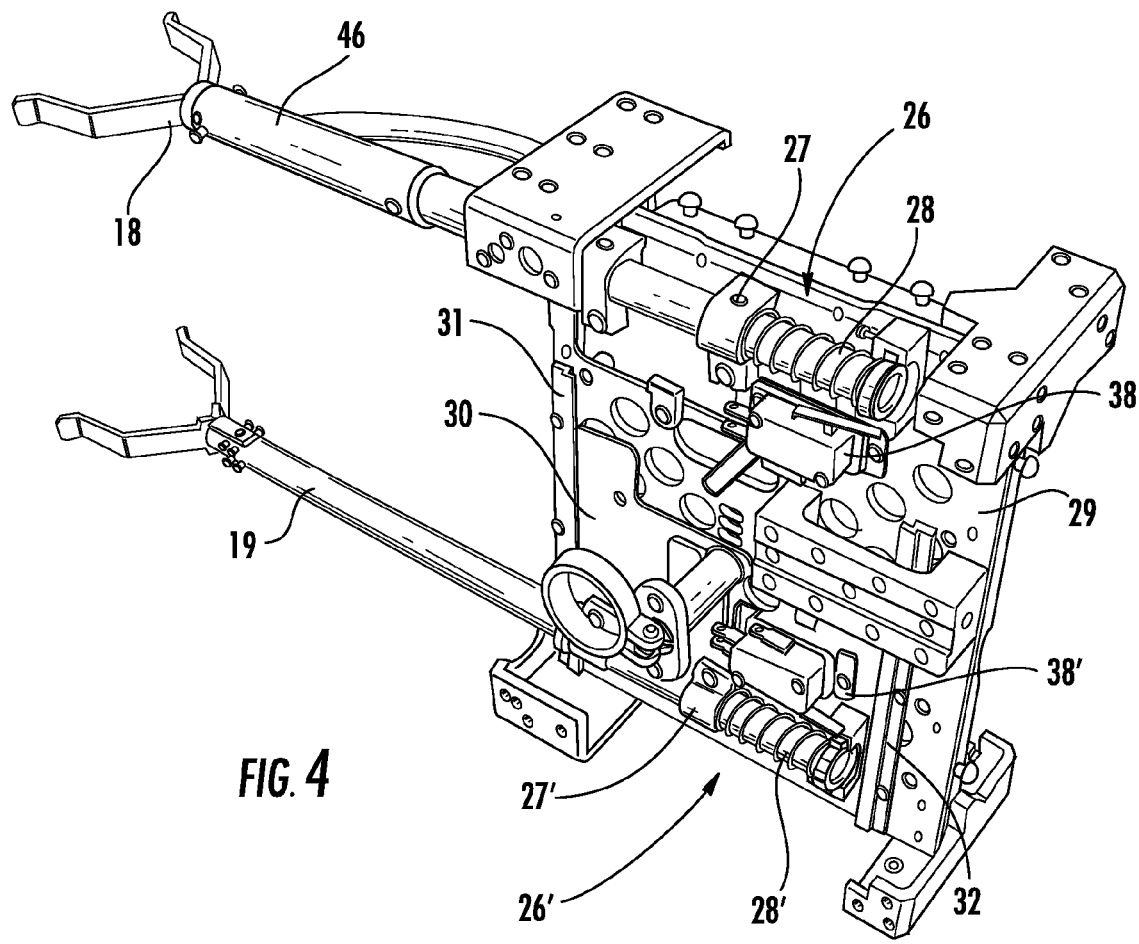
FIG. 4 shows the apparatus of FIG. 2 with a casing removed.
Figure 5:
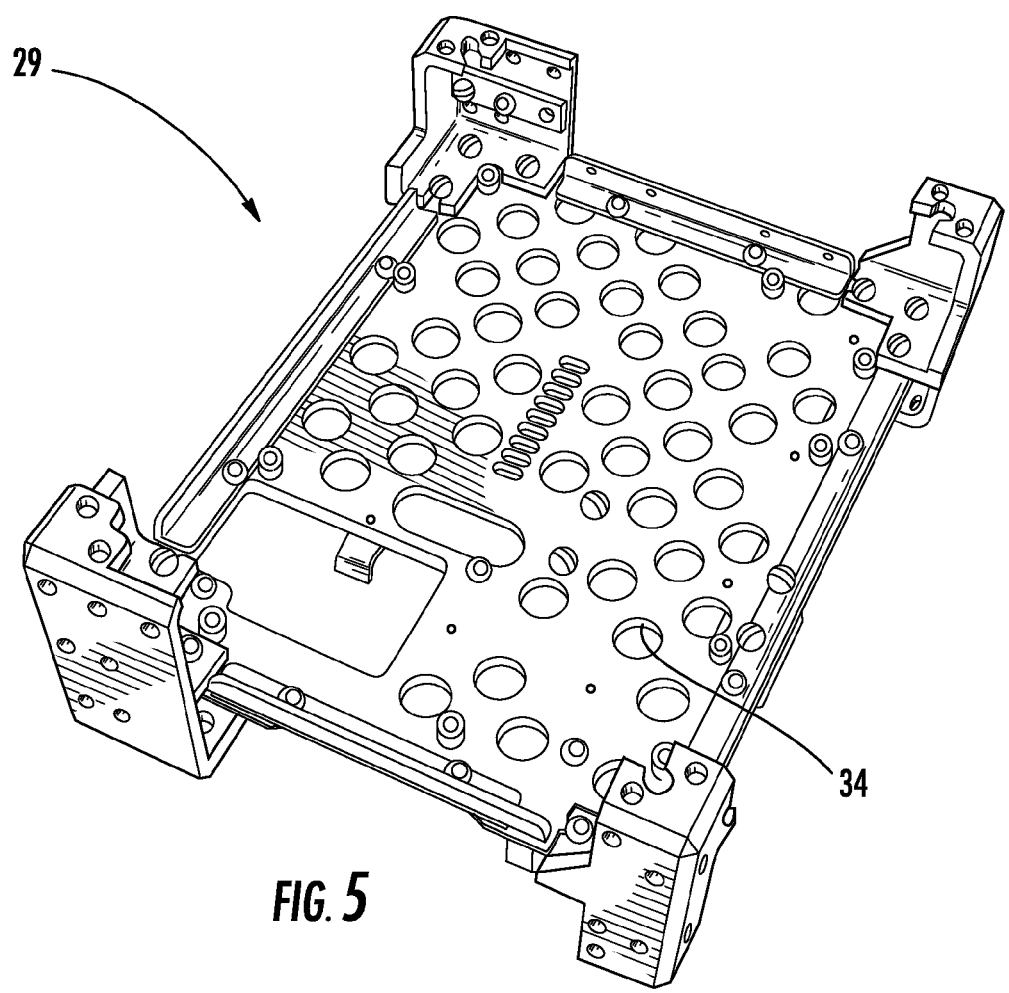
FIG. 5 shows a chassis of the apparatus of FIG. 1.
Figure 6:
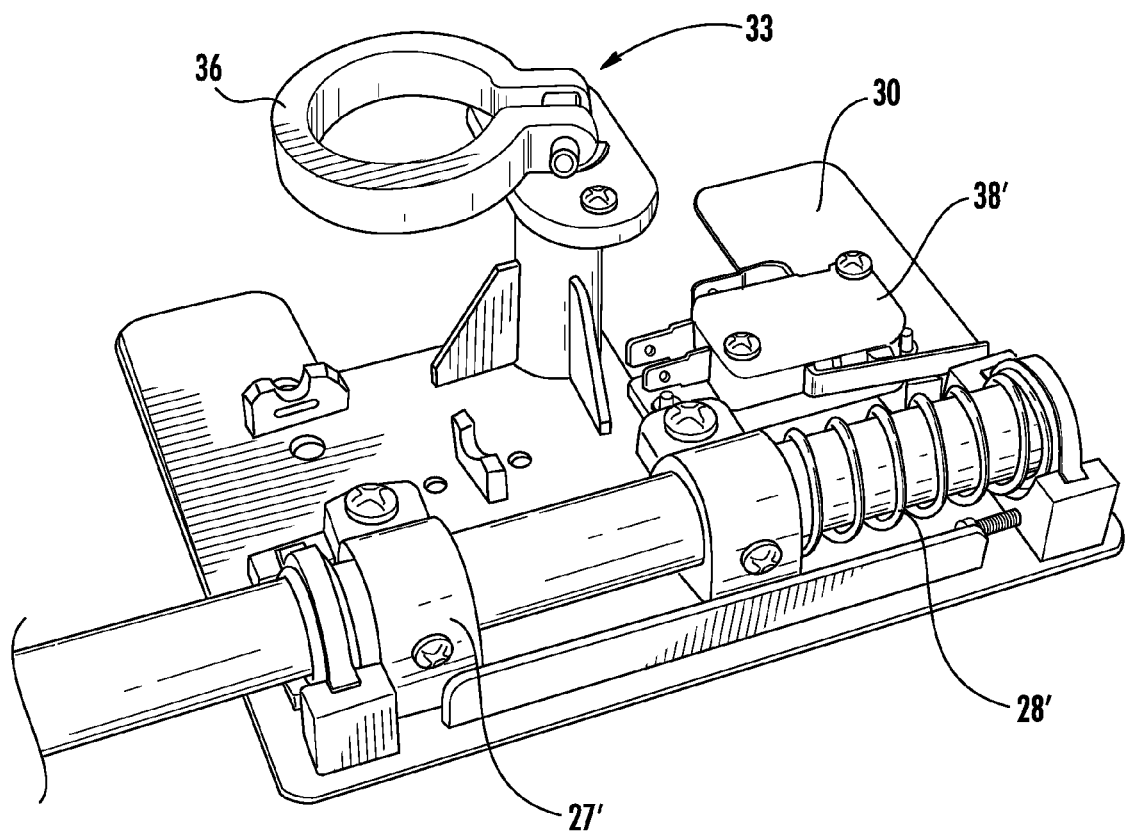
FIG. 6 shows a travelling plate for interaction with the chassis of FIG. 5.

Referring to FIG. 4, the electrode assemblies 18 and 19 are attached to spring loaded mechanisms 26 and 26' so that they can move linearly in and out from the enclosure 16. Electrode assembly 18 is connected to mechanism 26 and electrode assembly 19 is connected to mechanism 26'. The mechanisms 26 and 26' include bushings 27 and 27' and springs 28 and 28' to aid in the linear movement of the electrode assemblies 18 and 19. Mechanism 26 is connected to a chassis 29 (FIG. 5) and mechanism 26' is connected to both the chassis 29 and a travelling plate 30 (FIG. 6) which is adapted to move along rails 31 and 32 to allow the distance between the electrode assemblies 18 and 19 to be adjusted relative to each other to allow for different designs of insulators to be accounted for. As shown, the traveling plate 30 and mechanism 26' are secured in position to the chassis 29 by a spring loaded connector 33, FIG. 6, which pushes a spring-biased pin through the travelling plate 30 and into apertures 34 of the chassis 29 to prevent movement of the plate 30 along the rails 31, 32.

To move the plate 30 along the rails 31 and 32 and adjust the distance between electrode assemblies 18 and 19, a user pulls on a handle 36 of the connector 33 which moves the pin against the bias of the spring and disengages the pin from an aperture 34 of the chassis 29 to allow the plate 30 to move. Once the plate 30 and electrode 19 is in position, the user releases the handle 36 and the spring forces the pin into an aperture 34 of the chassis 29.

Figure 7:
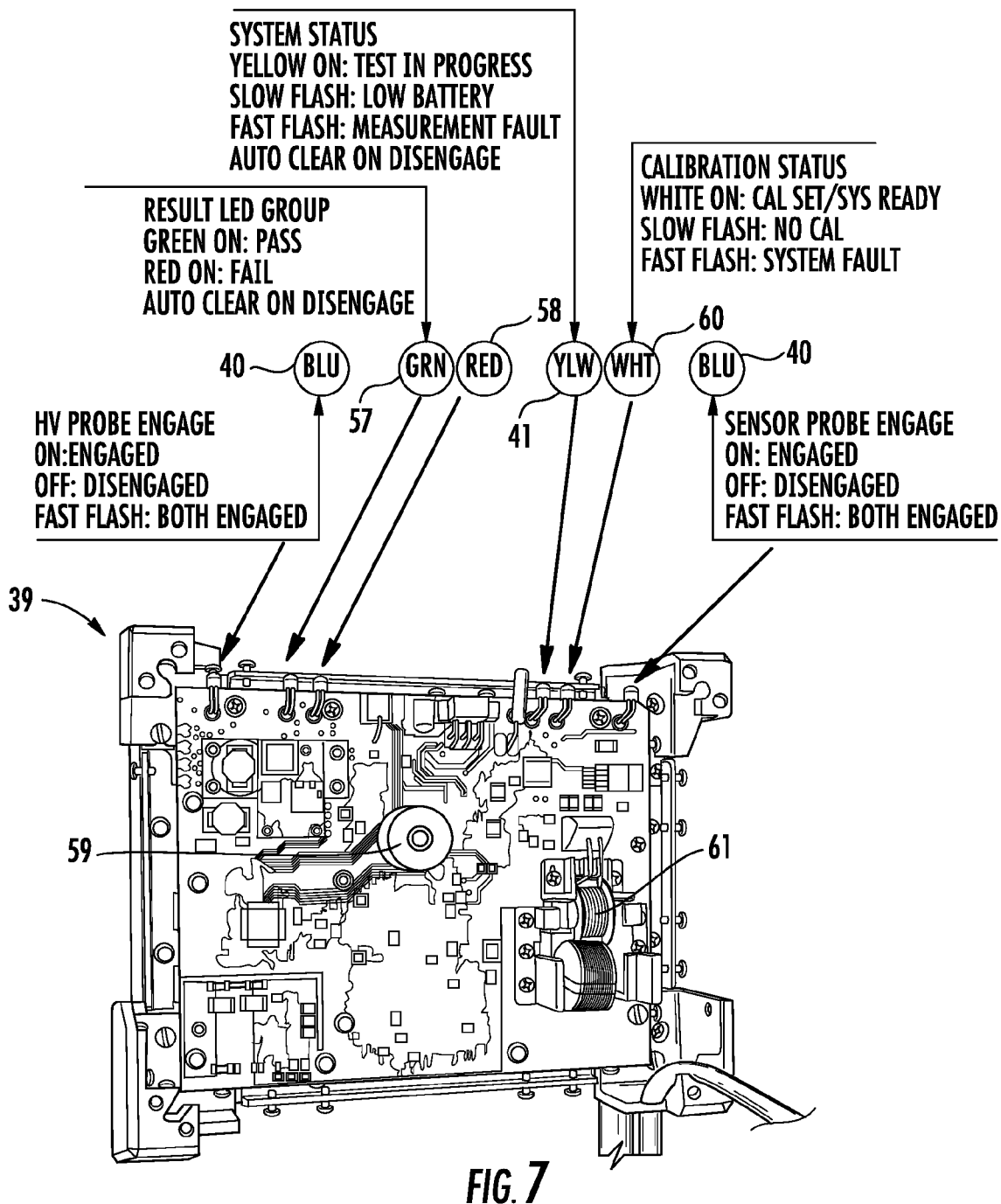
FIG. 7 shows electronics of the apparatus of FIG. 1.

Micro-switches 38 and 38' are also attached to the chassis 29 and are operably connected to the electrode assemblies 18 and 19 and electrically attached to electronics 39 to tell the electronics 39, FIG. 7, that a user has pushed the electrodes against an insulator and it is engaged. The micro-switches 38 and 38' are engaged when the electrodes have linearly moved into a predefined range (nominally between 0.75 inches and 1.0 inch). The detector 10 will only initiate a measurement when the micro-switches inform the electronics 39 that both electrode assemblies 18 and 19 are fully engaged. LEDs 40 communicate to a user whether and which electrode is engaged. If during a measurement process, one electrode is disengaged the user is informed by LED 41 that the measurement is not valid. In addition, audible beeping tones are used to communicate the engagement of the electrodes in the event that the user cannot see LEDs 40. The tones are activated when an electrode is engaged. A slow tone indicates that the grounded electrode is engaged and a fast tone indicates that the high voltage electrode is engaged. The tones are particularly useful in allowing a user to manipulate the detector 10 at the end of the hotstick to make sure both electrodes are engaged at the same time. When both electrodes are engaged, a solid tone is emitted to indicate that a measurement is taking place.

Figure 8:
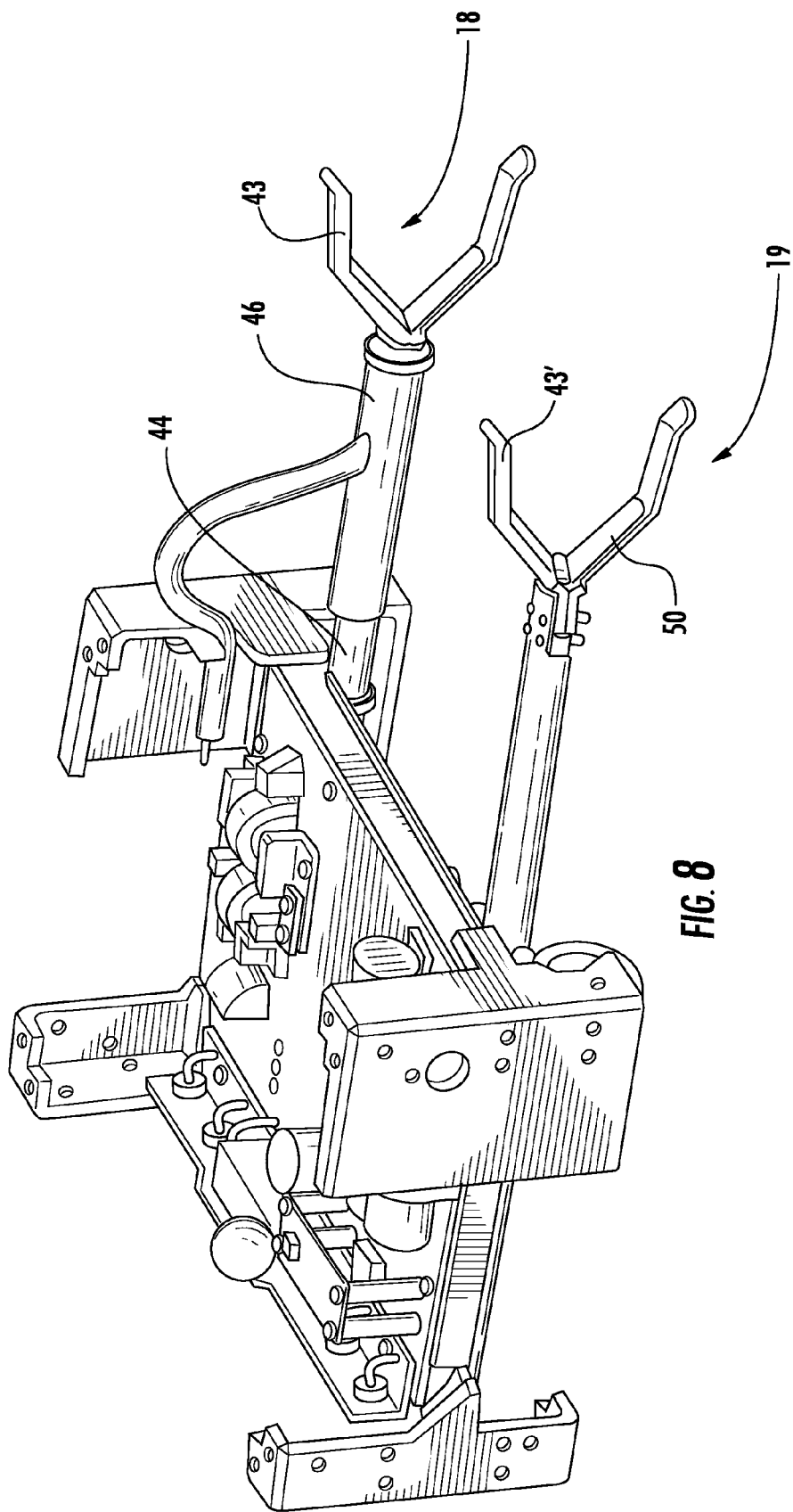

Referring to FIGS. 8 and 9, electrode assembly 18 includes a high voltage electrode 43 connected to a metallic shaft 44 by a insulating (in this case it is fiberglass but it could be any suitable insulating material) fiberglass rod 46. The fiberglass rod 46 electrically insulates the electrode 43 from the metallic shaft 44. The metallic shaft 44 connects the electrode assembly 18 to mechanism 26. Electrode assembly 19 includes a grounded electrode 43' connected to a metallic shaft 44'. The shaft 44' connects the electrode assembly 19 to mechanism 26'. The grounded electrode 43' and mechanisms 26 and 26' are grounded electrically to the chassis 29. Electrodes 43 and 43' may be "Y", "Hook", "Pincer", or any other suitable shape.

As illustrated in FIGS. 9A-C, the grounded electrode 43' includes a sensing probe or probes 50 attached to an end of the electrode 43'. The sensing probes are electrical conductors that are insulated from the electrode 43'. In the illustrated implementation, probes 50 include two flat strips of flexible circuit boards and are installed in cavities 51 of the electrode 43'. The implementation prevents the probes 50 from picking up stray electric fields from the high voltage electrode 43. A insulation strip 52 of insulating material, such as rubber, is placed on top of and in contact with the probe 50. The strip 52 has a pre-determined thickness and can deform to allow the probe 50 to be in contact with as much of the insulator under test as possible. It should be appreciated that the greater number of probes, the more sensitive the detector 10.

Referring to FIG. 7, the electronics 39 include a microprocessor which controls all of the measurement and communication processes. Once the electrodes are adjusted to the desired spacing, the user calibrates the device either with "nothing" between the electrodes or a "known" good section of insulator. LED 60 provides the calibration status. The electronics 39 use this against which to compare values. In performing measurements, the detector 10 is pushed against a good section of insulator until the micro-switches 38 and 38' provide an electrical signal to the LEDs 40 (one for each electrode assemblies, i.e., grounded and HV) to indicate that the electrodes are engaged or until a command is received by an RF receiver 56 from an RF control device. When LEDs 40 are lit, a measurement takes place.

Once the detector is engaged, a high voltage resonant voltage supply 61 sweeps through a frequency range and determines the resonance of the insulator. A high voltage at the resonant frequency is then supplied for a pre-determined amount of time, for example, 10 seconds. During this time, the current in HV supply, the drive level from power electronics to supply, the resonant frequency, and the measurements from sensing probes 50 are measured. The results are then compared against the "calibration" values. Depending whether the results are within some "predefined band" from the initial calibration, LED 57 or LED 58 is provided to the user. The results may also be sent to an RF enabled wireless device and/or via buzzer 59. Through the measurement process the buzzer 59 sounds so that the user knows a measurement is being made. The high voltage supply 61 is a custom high frequency (in the implementation 1-2 MHZ) high voltage supply (in the implementation 1-3 kV) that uses a custom ferrite transformer and power electronics to create the voltage.

The RF receiver 56 allows the unit to be remotely controlled and to provide results to an RF enabled device. In the implementation, WiFi is used and the device hosts an HTML interface (web page) which allows a laptop, phone or tablet to control the device and report results. This option is not always used—the user may also simply use LEDs 40, 41, 57, 58 together with the buzzer 59.

The detector 10 may also be battery powered. The battery may be rechargeable, such as a special lithium polymer battery which requires special charging. The electronics 39 contain charging intelligence and is capable of receiving power from an 8-14V DC source, e.g. from a car.

In operation, a test sequence is initiated by either the operator pushing the electrodes against the insulator or a remote RF enabled device (in this case any WiFi enabled computer, phone or tablet). A high frequency (in the implementation 1-2 MHZ) high voltage (in the implementation 1-3 kV) is placed across a section of the insulator, and the sensing probe 50 integrated into the grounded electrode 43' measures the capacitive and resistive currents. LED 57 indicates whether there is a condition based on (a) the sensing probe measurement, (b) the current drawn by the high voltage supply 61, and (c) the resonant frequency of the high voltage supply. LED 41 provides an indication of any erroneous measurement such as (a) the measurements do not fit the expected profile, (b) contact is lost with the insulator, (c) the on-board battery voltage is low, and (d) self diagnostics of the electronics. The remote RF enabled device also provides these indications plus more detailed information. It also keeps a history of the measurements and provides a graph of measurements along the insulator.

The foregoing has described an apparatus and method for identifying the presence of high conductivity or permittivity conditions in a wide range of electrically insulating materials. While specific embodiments of the present invention have been described, it will be apparent to those skilled in the art that various modifications thereto can be made without departing from the spirit and scope of the invention. Accordingly, the foregoing description of the preferred embodiment of the invention and the best mode for practicing the invention are provided for the purpose of illustration only and not for the purpose of limitation.

We claim:

1. An apparatus for identifying high risk insulators with conductive or high permittivity defects, comprising:
    (a) a metallic enclosure containing a microprocessor configured to control measurement and communication processes; and
    (b) first and second spaced-apart electrode assemblies, each including an exposed electrode configured to engage an insulator to be tested, the first and second electrode assemblies being mounted to the enclosure for linear movement between first and second positions, the microprocessor programmed to initiate a measurement from a probe mounted on one of the exposed electrodes in response to movement of the first and second electrode assemblies to the second position.

2. The apparatus according to claim 1, wherein the first electrode assembly is a high voltage electrode assembly.

3. The apparatus according to claim 1, wherein the second electrode assembly is an electrode grounded to the metallic enclosure assembly.

4. The apparatus according to claim 1, wherein the first electrode assembly is secured to a chassis contained in the enclosure by a spring loaded mechanism configured to allow the first electrode assembly to move linearly between the first and second positions.

5. The apparatus according to claim 1, wherein the second electrode assembly is secured to a moveable plate by a spring loaded mechanism configured to allow the second electrode assembly to move linearly between the first and second positions, the moveable plate being secured to a chassis contained in the enclosure by a spring loaded connector to allow the moveable plate to move along rails of the chassis and position the second electrode assembly at a pre-determined position relative to the first electrode assembly.

6. The apparatus according to claim 1, further including micro-switches attached to a chassis of the enclosure, the micro-switches being operably connected to the first and second spaced-apart electrode assemblies and electrically connected to the microprocessor, wherein when the first and second spaced-apart electrode assemblies are pushed against the insulator, the micro-switches tell the microprocessor to initiate the measurement.

7. The apparatus according to claim 1, wherein the first electrode assembly includes:
    (a) a metallic shaft for connecting the first electrode assembly to a chassis contained in the enclosure;
    (b) a fiberglass rod connected to the metallic shaft; and
    (c) a high voltage electrode connected to the fiberglass rod, wherein the fiberglass rod insulates the electrode from the metallic shaft.

8. The apparatus according to claim 1, wherein the second electrode assembly includes:
    (a) a metallic shaft configured to connect the second electrode assembly to a chassis contained in the enclosure; and
    (b) a grounded electrode connected to the metallic shaft and electrically grounded to the chassis.

9. The apparatus according to claim 1, further including a Faraday cage adapted to house the enclosure, the Faraday cage being adapted to minimize high electric field and arcing effects on the apparatus.

10. The apparatus according to claim 1, further including first and second tuning forks adapted to make mechanical and electrical contact with end fittings of an insulator to prevent arcing.

11. The apparatus according to claim 1, further including first and second bunny ears for extending the Faraday cage around the first and second electrode assemblies.

12. The apparatus according to claim 1, further including a hotstick receiver connected to the enclosure and bonded to a Faraday cage adapted to receive and connect a hotstick to allow the apparatus to be placed on an energized insulator.

13. An apparatus for identifying high risk insulators with conductive or high permittivity defects, comprising:
    (a) a chassis having a plurality of apertures and first and second rails;
    (b) a microprocessor mounted to the chassis for controlling measurement and communication processes;

(c) a high voltage electrode assembly connected to the chassis by a spring loaded mechanism to allow the high voltage electrode assembly to move linearly in and out from the chassis;

(d) a grounded electrode assembly connected to the chassis by a moveable plate and to the moveable plate by a spring loaded mechanism, the moveable plate adapted to move along the first and second rails to position the grounded electrode at a pre-determined spacing from the high voltage electrode assembly and the spring loaded mechanism adapted to allow the grounded electrode assembly to move linearly in and out from the chassis; and (e) wherein when the high voltage electrode assembly and grounded electrode assembly are pushed against an insulator, the electrode assemblies move linearly inward towards the chassis, thereby causing the electronics to initiate a test.

14. The apparatus according to claim 13, further including micro-switches operably connected to each of the high voltage electrode assembly and the grounded electrode assembly and electrically connected to the microprocessor, the micro-switches being adapted to signal the microprocessor when the high voltage electrode assembly and grounded electrode assembly have been pushed against an insulator.

15. The apparatus according to claim 13, wherein the high voltage electrode assembly includes:

(a) a metallic shaft for connecting the high voltage electrode assembly to the spring loaded mechanism;

(b) a fiberglass rod connected to the metallic shaft; and (c) a high voltage electrode connected to the fiberglass rod, wherein the fiberglass rod insulates the electrode from the metallic shaft.

16. The apparatus according to claim 13, wherein the grounded electrode assembly includes:

(a) a metallic shaft for connecting the grounded electrode assembly to the moveable plate;

(b) a grounded electrode connected to the metallic shaft and electrically grounded to the chassis; and (c) a sensing probe positioned in a cavity of the grounded electrode.

17. A method of evaluating insulators for defects, comprising the steps of:

(a) providing an apparatus for identifying high risk insulators, the apparatus including:
(i) a microprocessor;
(ii) a high voltage electrode assembly; and
(iii) a grounded electrode assembly;

(b) adjusting the high voltage electrode assembly and grounded electrode assembly to obtain a desired spacing;

(c) calibrating the apparatus to provide a calibration result set for comparison with measurements taken on an insulator;

(d) engaging the high voltage electrode assembly and grounded electrode assembly with an insulator to be tested;

(e) submitting the insulator to a high voltage at various frequencies to determine a resonance frequency of the insulator;

(f) submitting the insulator to a high voltage at the resonance frequency for a pre-determined amount of time; and (g) conducting measurements during the pre-determined amount of time for comparison to a the calibration result set.

18. The method according to claim 17, further including the step of measuring capacitive and resistive currents using the grounded electrode assembly.

19. The method according to claim 17, wherein the high voltage is in the range of 1 to 3 kV.

* * * * *